(12) United States Patent
Okuno

(10) Patent No.: US 6,211,691 B1
(45) Date of Patent: Apr. 3, 2001

(54) PROBE UNIT

(75) Inventor: Toshio Okuno, Yokohama (JP)

(73) Assignee: Soshotech Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/323,037

(22) Filed: Jun. 1, 1999

(30) Foreign Application Priority Data

Dec. 16, 1998 (JP) .................................................. 10-357541

(51) Int. Cl.$^7$ .................................................. G01R 31/02
(52) U.S. Cl. ........................... 324/762; 324/754; 324/72.5
(58) Field of Search .................... 324/754, 762, 324/72.5

(56) References Cited

U.S. PATENT DOCUMENTS 5,621,333 * 4/1997 Long et al. ........................... 324/762

* cited by examiner

*Primary Examiner*—Safet Metjahic
*Assistant Examiner*—Anjan K Deb
(74) *Attorney, Agent, or Firm*—Wenderoth, Lind & Ponack, LLP.

(57) ABSTRACT

A probe unit having a plurality of elongate leads disposed longitudinally in an array on a surface of an insulative sheet. Tip portions of the leads aligned along an end edge of the sheet are capable of being brought into contact, under pressure, with corresponding electrode pads of an electronic part. An insulative material is embedded in at least those areas of grooves between the tip portions of the leads. Slots, which are smaller in width than the leads, are formed between the tip portions of the leads. The tip portions of the leads have a reduced width and are longitudinally disposed on wide comb tooth like pieces of the insulative sheet isolated by the slots, and the insulative materials isolated by the slots are longitudinally intimately disposed along the opposite ends of the tip portions of the leads.

6 Claims, 3 Drawing Sheets

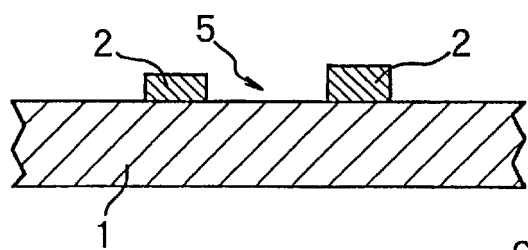
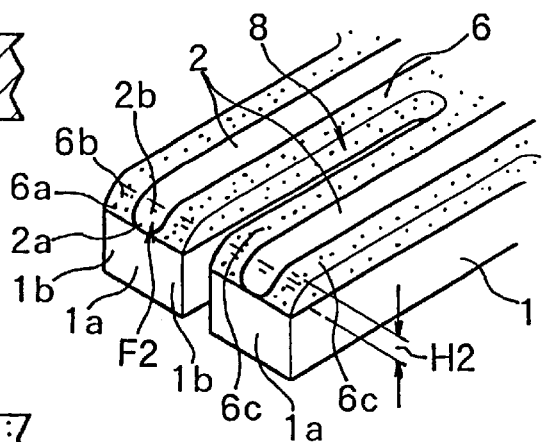
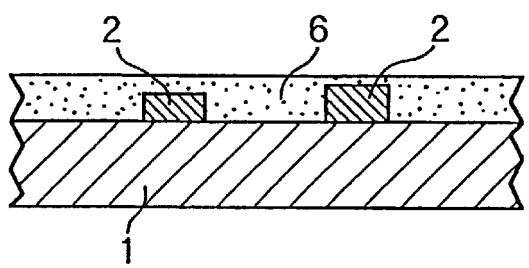
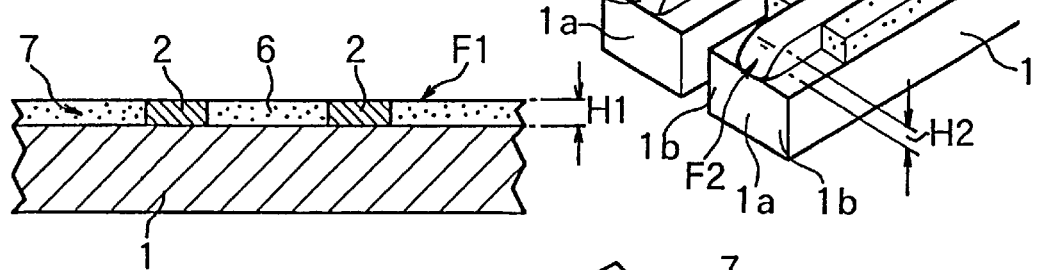
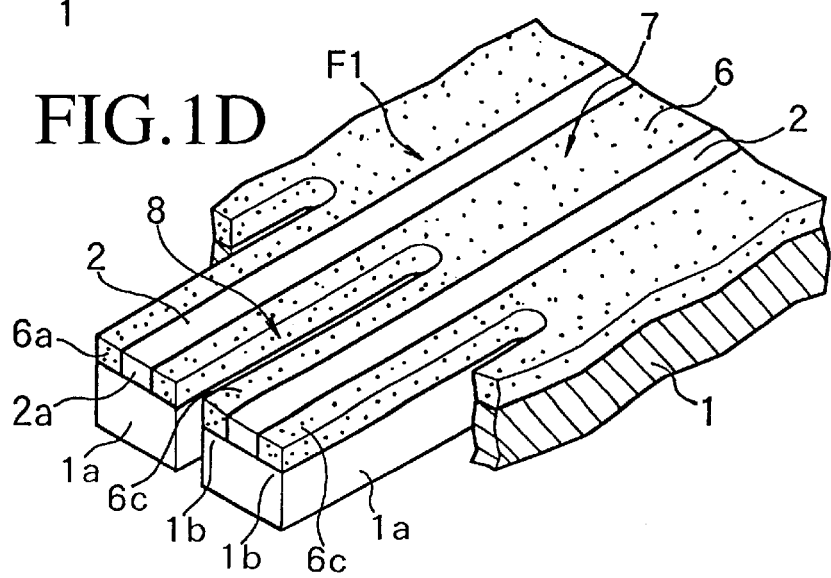

PROBE UNIT

BACKGROUND OF THE INVENTION

This invention relates to a probe unit which is to be subjected to pressure contact with electrode pads of a given electronic part such as a liquid crystal panel or the like when the electronic part is tested.

Conventional probe units used for testing a given electronic part such as a liquid crystal panel have a large number of leads arranged in an array on the surface of an insulative sheet. The distal end terminals of the respective leads are elastically contacted, under pressure, with corresponding electronic pads of the electronic part, and testing is carried out by a tester connected to the basal ends of the leads.

A rigid holder is adhered to the surface of the insulative sheet on the other side of the elongate leads, and the lead terminals are allowed to project from the terminal of the holder together with the insulative sheet terminal. The lead terminals are bent at those projecting portions together with the film terminals, so that they are pressure contacted with the corresponding pads.

Recently, in order to facilitate a very small pitch arrangement of the leads, there was employed a process for growing the leads on the insulative sheet by plating, through application of the additive process, etc. However, since the leads are irregularly grown by plating, they are not made uniform in height in the direction of their thickness. This gives rise to a problem in that the leads do not evenly contact with the corresponding electrode pads.

Moreover, in order to reduce the contact area with the insulative sheet, the lead terminals are repeatedly bent together with the sheet end edge and pressure contacted with the corresponding electrode pads. This also gives rise to a problem in that peel-off occurs between the lead tip terminals and the sheet end edge.

Since the leads are very tiny and weak, it is difficult to obtain a sufficient elastic force, i.e., pressure contact force for each lead terminal.

The present invention has been accomplished in view of the above problems.

SUMMARY OF THE INVENTION

It is, therefore, an object of the present invention to provide a probe unit capable of effectively solving the above-mentioned problems inherent in the prior art devices.

In order to achieve the above object, according to the present invention, there is essentially provided a probe unit having a plurality of elongate leads disposed longitudinally in an array on a surface of an insulative sheet, tip terminals of the leads aligned along an end edge of the sheet being brought into contact, under pressure, with corresponding electrode pads of an electronic part, wherein, an insulative material is embedded in at least those areas of grooves between tip portions of the leads. Slots, which are smaller in width than the leads, are formed between the tip portions of the leads, the tip portions of the leads having a reduced width are longitudinally disposed on wide comb tooth like pieces of the insulative sheet isolated by the slots, and the insulative materials isolated by the slots are longitudinally intimately disposed along opposite ends of the tip portions of the leads.

BRIEF DESCRIPTION OF THE DRAWING

FIGS. 1A to 1E2 show a process for manufacturing a probe unit according to one embodiment of the present invention and are views for explaining a structure of the probe unit;

FIG. 2 is a plan view showing another embodiment of the probe unit;

DETAILED DESCRIPTION OF THE EMBODIMENT

Figure 2:
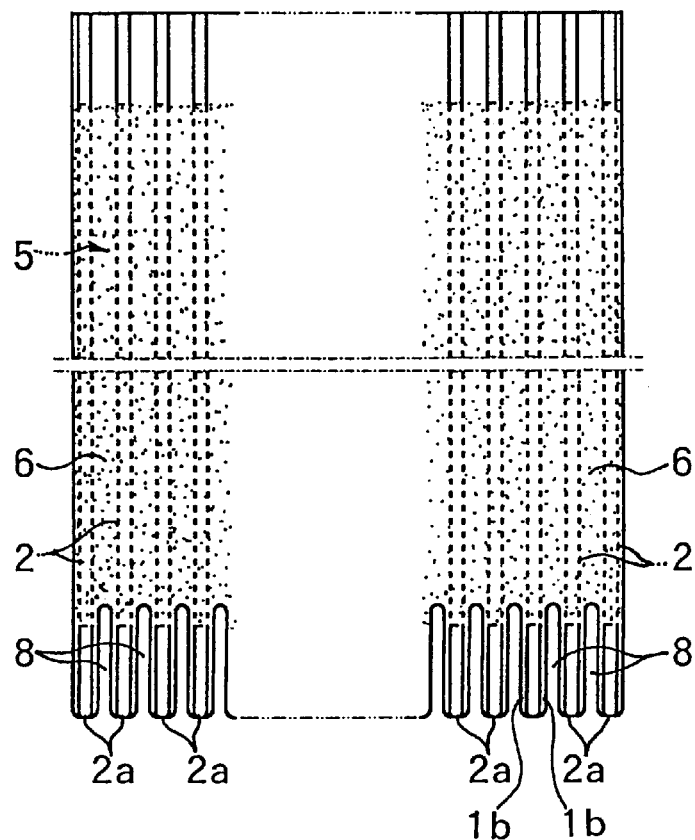

Embodiments of the present invention will now be described with reference to FIGS. 1 to 4 of the accompanying drawing.

As shown in FIGS. 1E, 1E2, 3 and 4, as well as elsewhere, a probe unit has a large number of elongate leads 2 arranged in an array and extended longitudinally on a surface of an insulative sheet 1 having flexible properties. Tip terminals 2a of the respective leads 2 are orderly arranged along an end edge of the insulative sheet 1 and are brought into contact, under pressure, with corresponding electrode pads of a given electronic part 3. In this way, the probe unit of the present invention serves as a contact medium with respect to a tester, etc.

As shown in FIG. 1A, a probe unit is prepared in which a large number of elongate leads 2 are arranged in an array at very small pitches and extended longitudinally on the surface of the insulative sheet 1.

The insulative sheet 1 is, for example, a polyimide sheet. The leads 2 are grown by plating on the insulative sheet 1 through a known additive process.

Then, as shown in FIG. 1B, insulative material 6 is embedded in grooves 5 which are formed between the adjacent leads 2 over the entire length of the leads 2. The insulative materials 6 may be embedded in only those areas of the grooves 5 between the tip portions of the leads 2.

The insulative material 6 is, for example, epoxy resin or thermoplastic polyimide. The insulative material 6 is embedded in the grooves 5 between the adjacent leads 2 and applied in such a manner as to cover the leads 2, and then hardened by heating.

Then, as shown in FIG. 1C, entire surfaces of the insulative material 6 between the adjacent leads 2 and the leads 2 themselves, entire surfaces of lead embedding layers 7, on the other side of the insulative sheet 1 are polished so that they are flush with each other. By doing so, the leads 2 and the insulative material 6 between the adjacent leads 2 are uniform in height H1 in the direction of their thickness on the coplanar surface F1 over the entire surface including their tip portions.

Also, those surfaces of the tip portions of the leads 2 and insulative material 6 between the adjacent leads 2 on the other side of the insulative sheet 1 are polished so that they are flush with each other. By doing so, the leads 2 and the insulative material 6 between the adjacent leads 2 are uniform in height H1 in the direction of their thickness on the coplanar surface F1.

That is, the height H1 of the entire length or only the tip portions of the leads 2 is made uniform on the coplanar surface F1 with the height H1 of the entire length or only the tip portion of the insulative material 6 between the adjacent leads 2. By doing so, the single lead embedding layer 7 having a uniform thickness is formed in which the leads 2 and insulative material 6 are integral with each other at their entire length or only at their tip portions.

Figure 3:
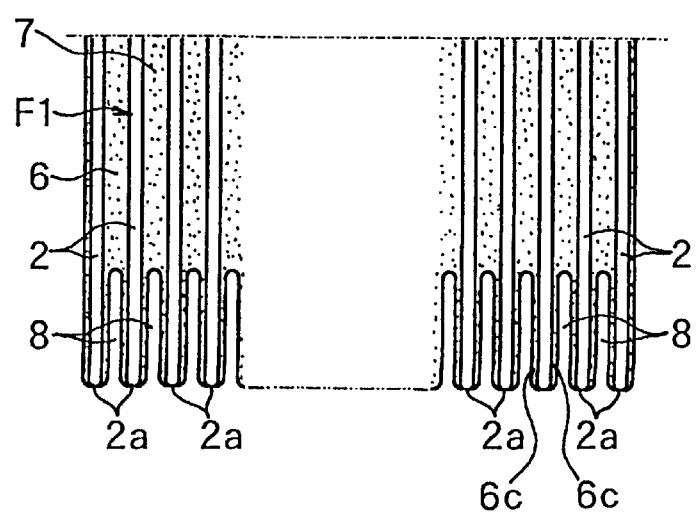
FIG. 3 is a plan view showing a contact end of the probe unit when viewed from the contacting side.

Then, as shown in FIGS. 1D and 3, slots 8 having a smaller width than the grooves 5 are formed, by laser beam, in the insulative sheet portion between the tip portions of the leads 2 and the insulative material portion between the adjacent leads 2. That is, the slots 8 are narrow and do not reach the side surfaces of the lead tip portions. Those slots 8 are open at tip portion end faces of the leads 2 and an end face of the sheet 1.

Thus, the tip portions of the leads 2 are isolated from each other through the slots 8. Similarly, the insulative sheet 1 and the insulative material 6 between the adjacent leads 2 are isolated through the slots 8 at those areas between the adjacent tip portions of the leads 2.

In other words, the insulative sheet 1 is formed at an end edge thereof with comb tooth like pieces (comb tooth-like portions) which are larger in width than the lead tip smaller in width than the comb tooth like pieces 1a, are longitudinally disposed on surfaces of the comb tooth like pieces 1a.

By dividing the insulative material 6 between the adjacent leads 2 at those areas between the adjacent lead tip portions through the slots 8, the divided insulative material elements 6c are disposed longitudinally along opposite sides of the lead tip portions. The insulative material elements 6c disposed longitudinally along the opposite sides of the lead tip portions are intimately adhered to and supported on protrusion edge portions 1b of the comb tooth like pieces 1a protruding sideways of the lead tip portions. Thus, the lead tip portions, the comb tooth like pieces 1a and the insulative material 6 are able to move vertically independently.

As shown in FIG. 1E1, tip terminals 2a of the respective leads 2 and tip terminals 6a of the insulative material 6 are polished until they exhibit identical slanted surfaces 2b, 6b, and the terminals 2a, 6a are made uniform in height H2 in the direction of their thickness. Then, the slanted surfaces 2b of the tip terminals 2a of the leads 2 are subjected to pressure contact with the corresponding electrode pads 4.

As another example, as shown in FIG. 1E2, a probe unit has a plurality of leads 2 longitudinally disposed on the surface of the insulative sheet1. Tip terminals 2a of the leads 2 arranged in array along an end edge of the sheet 1 are brought into contact, under pressure, with corresponding electrode pads 4 of the electronic part 3. An insulative material 6 is embedded in at least those areas of the grooves 5 between the tip portions of the leads 2 excluding the groove terminal portions between the adjacent tip terminal portions 2a of the respective leads 2. In the alternative, the insulative material 6 is embedded in the grooves over an entire length thereof, only excluding the groove terminal portions between the adjacent tip terminals 2a of the respective leads 2, and the tip surfaces of the insulative material 6 and leads 2 on the other side of the insulative sheet 1 or the entire surfaces over the entire length thereof are polished so that the height H1 of the tip portions in the direction of their thickness is made uniform on a coplanar surface.

As in the preceding example, the tip terminals 2a of the leads 2 are polished so that they exhibit identical slanted surfaces 2b, and the height H2 of the terminals 2a, 6a in the direction of their thickness is made uniform on the slanted surfaces F2. Then, the slanted surfaces 2b of the tip terminals 2a of the leads 2 are subjected to pressure contact with the corresponding electrode pads 4.

FIG. 2 shows a concrete example of the present invention. In this example, the insulative material 6 is embedded in the grooves 5 over the entire length, between the adjacent leads 2, and the surfaces of the leads 2 are covered with the insulative material 6. The distal end portions and basal end portions of the leads 2 and the distal end portions and basal end portions of the insulative material 6 are polished so that they are flush with each other and the height thereof is made uniform. Then, the distal end portions of the leads 2 are subjected to contact with the corresponding electrode pads 4 and the basal end portions of the leads 2 are subjected to connection with a tester.

Accordingly, the elongate probe unit is covered at an intermediate portion thereof with the insulative material 6, and only the distal end portions and basal end portions are polished over a predetermined width. The leads 2 are allowed to expose over this width.

Figure 4:
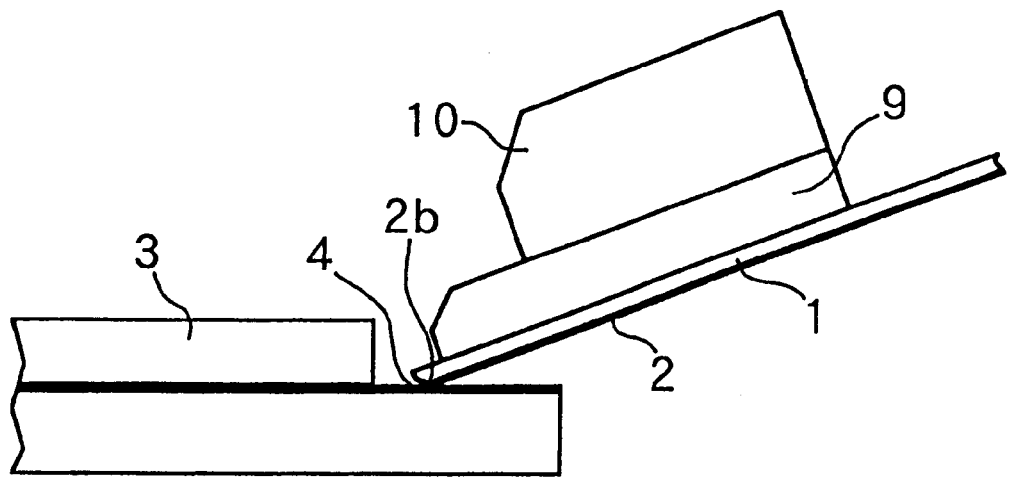
FIG. 4 is a side view showing a contactor assembly composed of the probe unit which is in contact with a given electronic part.

As shown in FIG. 4, an elastic plate 9 of an urethane rubber is adhered to that surface of the insulative sheet 6 on the other side of the elongate leads 2 and the distal end portions of the leads 2 are allowed to project together with the end edge of the insulative sheet 6. A rigid holder 10 is adhered to that surface of the elastic plate 9 on the other side of the insulative sheet 6. Then, the whole assembly is slanted forwardly, so that the slanted surfaces 2b of the terminals 2a of the projecting tip portions of the leads 2 are brought into contact, under pressure, with the corresponding electrode pads 4 of a given electronic part 3 such as a liquid crystal panel.

According to the present invention, the elongate leads disposed longitudinally on the insulative sheet become uniform in height and therefore, the problem of irregularity in contact pressure can effectively be solved.

The leads and the insulative material between the adjacent leads form an integral embedding layer, thereby not only the leads themselves are increased in strength but also the leads and insulative sheet are increased in combined strength. Therefore, the problem of peeling-off of the lead tip portions which are subjected to pressure contact, and the problem of lack of elasticity can effectively be obviated.

Moreover, by virtue of the reinforcing structure with respect to the leads, the leads are not degraded in strength even if they are made very small in size and the requirement of a very small pitch arrangement can effectively be fulfilled.

It is to be understood that the embodiments of the invention herein set forth are presented for the purpose of illustration only, and various changes may be made without departing from the spirit of the invention and the scope of the claim.

What is claimed is:

1. A probe unit, comprising:

an insulative sheet having a plurality of comb tooth-like portions with an end edge, wherein slots are formed between said comb tooth-like portions;

a plurality of elongated leads having tip portions and being disposed longitudinally in an array on a surface of said insulative sheet, wherein said tip portions are aligned along said end edge; and an insulative material being disposed on said comb tooth-like portions of said insulative sheet, wherein said insulative material is alongside said tip portions and flush with top surfaces of said tip portions of said plurality of elongated leads.

2. A probe unit according to claim 1, wherein said insulative sheet is a polyimide sheet.

3. A probe unit according to claim 1, wherein said insulative material comprises at least one of epoxy resin and thermoplastic polyimide.

4. A probe unit according to claim 1, wherein each one of said tip portions is disposed on a respective one of said plurality of comb tooth-like portions.

5. A probe unit according to claim 4, wherein each one of said tip portions is centrally disposed on said respective one of said plurality of comb tooth-like portions and said insulative material is disposed on said plurality of comb-like portions on both sides of said tip portions.

6. A probe unit according to claim 1, wherein said insulative material is disposed on the remainder of said surface of said insulative sheet not covered by said plurality of elongated leads.

* * * * *